US011233080B2

(12) United States Patent
Liu et al.

(10) Patent No.: US 11,233,080 B2
(45) Date of Patent: Jan. 25, 2022

(54) IMAGE SENSOR WITH PARTIALLY ENCAPSULATING ATTENUATION LAYER

(71) Applicant: OMNIVISION TECHNOLOGIES, INC., Santa Clara, CA (US)

(72) Inventors: Yuanliang Liu, San Jose, CA (US); Bill Phan, San Jose, CA (US); Duli Mao, Sunnyvale, CA (US)

(73) Assignee: OMNIVISION TECHNOLOGIES, INC., Santa Clara, CA (US)

( * ) Notice: Subject to any disclaimer, the term of this patent is extended or adjusted under 35 U.S.C. 154(b) by 106 days.

(21) Appl. No.: 16/730,137

(22) Filed: Dec. 30, 2019

(65) Prior Publication Data
US 2021/0202554 A1  Jul. 1, 2021

(51) Int. Cl.
*H01L 27/146* (2006.01)

(52) U.S. Cl.
CPC .... *H01L 27/14618* (2013.01); *H01L 27/1463* (2013.01); *H01L 27/14627* (2013.01); *H01L 27/14683* (2013.01)

(58) Field of Classification Search
CPC ......... H01L 27/14618; H01L 27/14683; H01L 27/1463; H01L 27/14627
See application file for complete search history.

(56) References Cited

U.S. PATENT DOCUMENTS

| 9,704,904 | B2 | 7/2017 | Lai et al. |
| 10,141,360 | B2 | 11/2018 | Leung et al. |
| 2020/0321376 | A1* | 10/2020 | Noudo .............. H01L 27/14603 |

* cited by examiner

*Primary Examiner* — David Vu
(74) *Attorney, Agent, or Firm* — Christensen O'Connor Johnson Kindness

(57) ABSTRACT

A pixel cell includes a first photodiode, a second photodiode, a first deep trench isolation region, a second deep trench isolation region, a buffer oxide layer, and a light attenuation layer. The attenuation layer partially encapsulates the first photodiode by extending laterally from the first deep trench isolation region to the second deep trench isolation region between the semiconductor material and the buffer oxide layer.

32 Claims, 6 Drawing Sheets

US 11,233,080 B2

IMAGE SENSOR WITH PARTIALLY ENCAPSULATING ATTENUATION LAYER

TECHNICAL FIELD

This disclosure relates generally to image sensors, and in particular but not exclusively, relates CMOS image sensors and applications thereof.

BACKGROUND INFORMATION

Image sensors have become ubiquitous and are now widely used in digital cameras, cellular phones, security cameras, as well as, medical, automobile, and other applications. As image sensors are integrated into a broader range of electronic devices it is desirable to enhance their functionality, performance metrics, and the like in as many ways as possible (e.g., resolution, power consumption, dynamic range, etc.) through both device architecture design as well as image acquisition processing.

The typical image sensor operates in response to image light reflected from an external scene being incident upon the image sensor. The image sensor includes an array of pixels having photosensitive elements (e.g., photodiodes) that absorb a portion of the incident image light and generate image charge upon absorption of the image light. The image charge of each of the pixels may be measured as an output (e.g., a voltage, a current, etc.) of each photosensitive element that varies as a function of the incident image light. In other words, the amount of image charge generated is proportional to the intensity of the image light, which is utilized to produce a digital image (i.e., image data) representative of the external scene.

BRIEF DESCRIPTION OF THE DRAWINGS

Non-limiting and non-exhaustive embodiments of the invention are described with reference to the following figures, wherein like reference numerals refer to like parts throughout the various views unless otherwise specified. Not all instances of an element are necessarily labeled so as not to clutter the drawings where appropriate. The drawings are not necessarily to scale, emphasis instead being placed upon illustrating the principles being described.

DETAILED DESCRIPTION

Figure 1A:
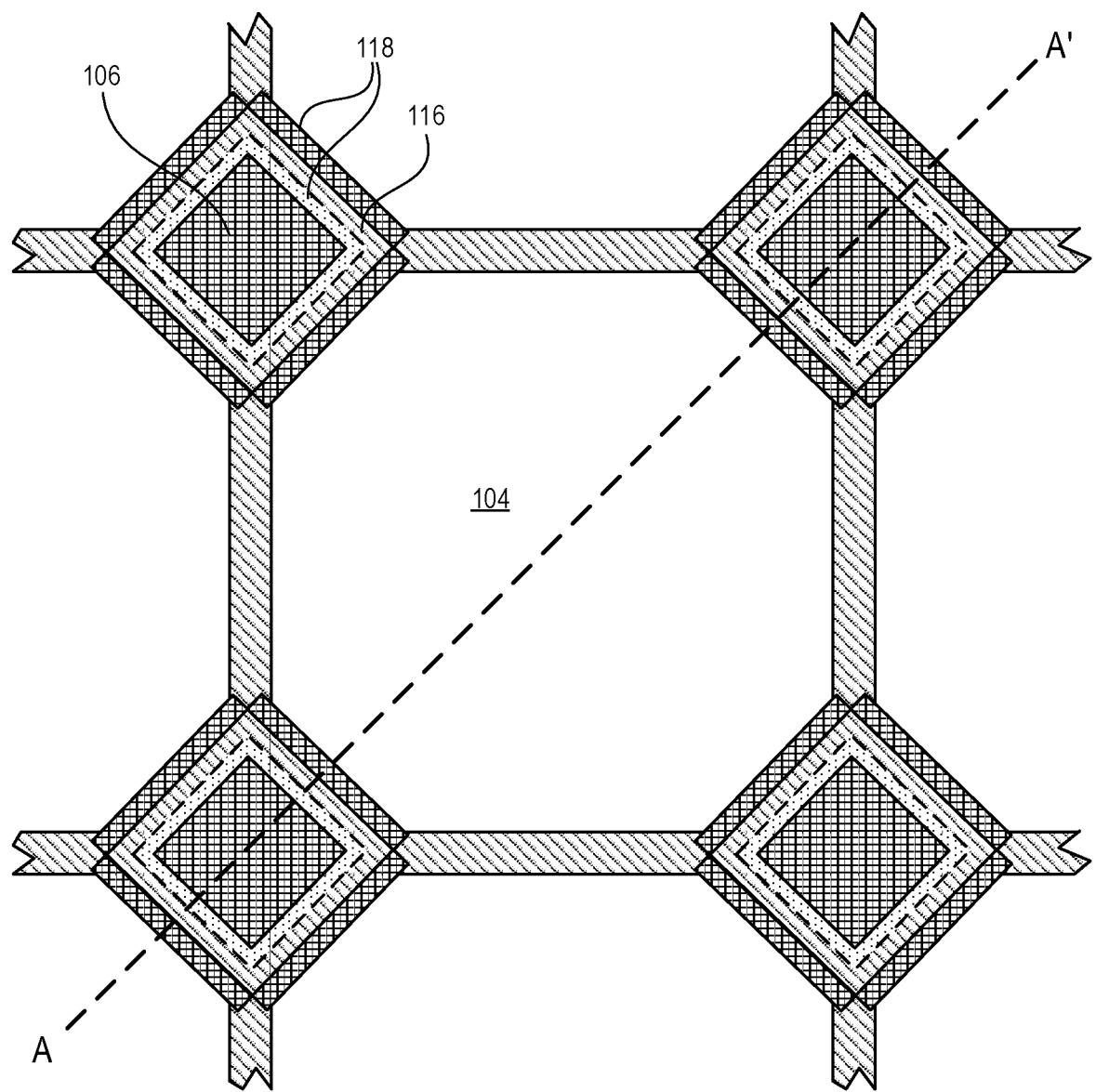
FIG. 1A illustrates a top view of an example image sensor with a partially encapsulating light attenuation layer, in accordance with the teachings of the present disclosure.

Embodiments of an apparatus, system, and method each including or otherwise related to an image sensor with a partially encapsulating attenuation layer are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meaning.

The image sensors of the present disclosure have at least a large photodiode for low light detection and a small photodiode for bright light detection to realize high dynamic range for image sensing. To reduce possible LED flickering, the small photodiode should have lower quantum efficiency (e.g., less than 0.5%). To have improved pixel performance, lower crosstalk between the photodiodes is desirable such that photodiode quantum efficiency can be lowered and thereby suppress petal flare.

To illustrate, FIG. 1A is a top view of an example image sensor 100 having large and small pixel cells with correspondingly large 104 and small 106 photodiodes. In one example, the small pixels 106 may be square and oriented 45 degrees from the orientation of the grid of large pixels 104. In some embodiments, small photodiodes (SPDs) 106 of small pixels are surrounded by large photodiodes (LPDs) 104 of large pixels. Both the small pixels 106 and the large pixels 104 may be surrounded by a metal grid 116 formed of a plurality of intersecting metal structures. The metal grid 116 can improve the isolation of the small photodiodes 106 and the large photodiodes 104 by reflecting or absorbing light hitting the surface at a high angle of incidence (the angle between the incident light and a line normal to the surface). According to one example of the disclosure, the image sensor 100 includes light attenuation layer 118 disposed under the metal grid 116 partially encapsulating and extending over the small photodiodes 106; the light attenuation layer 118 can further extend into the deep trench isolation structures surrounding the small photodiodes 106. Light attenuation layer and attenuation layer may be used interchangeably throughout the present disclosure.

The partially encapsulating light attenuation layer 118 is arranged to cover the surface of small photodiodes 106 to reduce crosstalk into the adjacent small photodiodes 106 without reducing the quantum efficiency of the large photodiodes 104. Without wishing to be bound by theory, it is believed that crosstalk can be caused by light with a high incident angle received by the large photodiodes 104. By reducing crosstalk, petal flare can be suppressed, and pixel performance can be improved.

Referring again to FIG. 1A, the portion of the image sensor 100 is depicted in the illustrated example with a single large photodiode 104 and four small photodiodes 106 for explanation purposes. However, it is appreciated that image sensor 100 can have different layouts and include any number of large 104 and small photodiodes 106. The concepts described herein may apply to other photodiode layouts and pixel architectures.

Figure 1B:
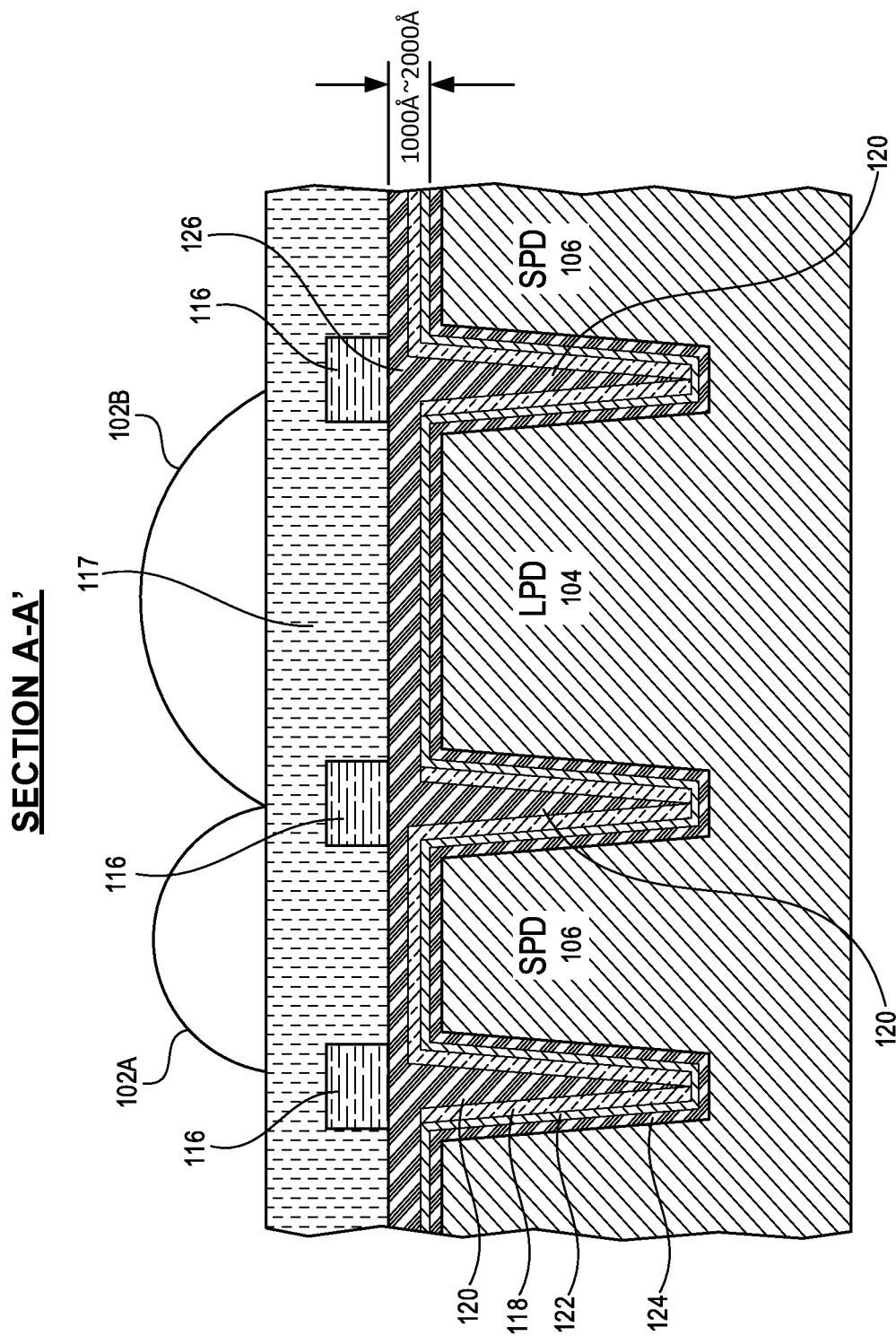
FIG. 1B is a cross-section view illustrating one example of a portion of an image sensor in accordance with the teachings of the present invention.

FIG. 1B is a cross-sectional illustration of one example of a portion of a pixel array of an image sensor with a partially encapsulating attenuation layer 118, in accordance with the teachings of the present invention. Referring to FIG. 1B, the image sensor 100 has a first microlens 102A, a second microlens 102B, a metal grid 116, a color filter layer 117, a large photodiode (LPD) 104, and a small photodiode (SPD) 106. Between the small photodiode 106 and the large photodiode 104 is a deep trench isolation structure (DTI) 120. A high-κ oxide layer 124 overlays the small photodiode 106 and the large photodiode 104. The high-κ oxide layer 124 can include HfO and/or Al$_2$O$_3$, and can have a thickness of from 10 Å to 100 Å. As used herein, recited ranges include the end points, such that from 10 Å to 100 Å includes both 10 Å and 100 Å. In some embodiments, the high-κ oxide layer 124 contains negative fixed charges forming a hole accumulation region around the deep trench isolation structure 120 for passivating sidewalls and at the bottom of the deep trench isolation structure 120. The amount of negative fixed charges contained in the high-κ oxide layer 124 is related to the thickness of the high-κ oxide layer 124.

An optionally present thin oxide layer 122 can be disposed over the high-κ oxide layer 124. The thin oxide layer 122 can preserve the hole accumulation region, thereby improving electrical isolation and reduce white pixels. The thin oxide layer (e.g., silicon dioxide layer) 122 can have a thickness ranging from 30 Å to 100 Å.

A partially encapsulating light attenuation layer 118 is then disposed over DTI 120 and the small photodiode 106, but not over the large photodiode 104 to attenuate light directed to small photodiode 106 and reduce light sensitivity of small photodiode 106. In some embodiments, thin oxide layer 122 (when present) and high-κ oxide layer 124 are disposed over the entirety of the small photodiode 106 and large photodiode 104, as well as the DTI structures 120.

In some embodiments, contact between the high-κ oxide layer 124 and silicon (semiconductor material) can result in stress to the underlying silicon, thereby causing dark current. In some embodiment, another layer prior to the formation of the high-κ oxide layer 124, i.e., a thin stress-relieving layer, may be deposited between the sidewalls of deep trench isolation structure (DTI) 120 and the high-κ oxide layer 124. The stress-relieving layer may be a thin oxide layer formed by thermal oxidation. The thickness of the thin stress-relieving can range from 30 Å to 100 Å.

Referring again to FIG. 1B, the image sensor has a buffer oxide layer 126 disposed over the encapsulating partially encapsulating light attenuation layer 118, when the thin oxide layer 122 is absent; over the thin oxide layer 122, when present; or over the high-κ oxide layer 124 (when both the partially encapsulating light attenuation layers 118 and the thin oxide layer 122 are absent). The buffer oxide layer 126 can have a thickness of from 1000 Å to 2000 Å.

In some embodiments, the metal grid 116 is disposed on the buffer oxide layer 126 above each respective deep trench isolation structure 120. In some embodiments, the metal grid 116 is vertically aligned with each respective deep trench isolation structure 120. In some embodiments, the metal grid 116 is slightly shifted with respect to deep trench isolation structure 120 formed underneath, depending on the location in a pixel array, to accommodate chief ray angle at the respective location for better crosstalk reduction.

In embodiments, gaps or openings between metal grid 116 may be filled with a polymer forming a color filter array in color filter layer 117. Thus, gaps or openings in the metal grid 116 are disposed to receive individual color filters in the color filter array such that that the metal grid 116 is disposed between the individual color filters and surrounds individual color filters. Gaps or openings of the metal grid 116 may correspond to the spacing between deep trench isolation structures 120. Alternatively, metal grid 116 is positioned such that gaps or openings of the metal grid 116 are above the light exposure area of the first photodiode 106 and the second photodiode 104, thereby enabling incident light directed to and filtered by the respective color filters of the color filter layer 117 to be received by the corresponding first photodiode 106 and the second photodiode 104. In some embodiments, the color filter layer 117 includes a color filter array such as a Bayer pattern. In some embodiments, the color filter layer 117 includes a mosaic of red, green, blue, and clear additive filters (e.g., RGB, RGBG or GRGB, CRBC, GBRC) or a color filter pattern of cyan, magenta, yellow, and key (black) subtractive filters (e.g., CMYK). A portion of light incident on backside 108A of image sensor 100 that is oblique to surface normal of semiconductor material 108 may be reflected by metal grid 116 onto the respective first photodiode 106 and the second photodiode 104.

An array of microlenses 102A and 102B may be present over the buffer oxide layer 126, metal grid 116, and color filter layer 117. The microlenses 102A and 102B can be aligned with each of the small and large photodiodes 106 and 104, respectively. The crosstalk due to light hitting at a high angle of incidence can be reduced at small photodiode 106 by the presence of the partially encapsulating light attenuation layer 118, without reducing the quantum efficiency of the large photodiode 104.

Figure 2:
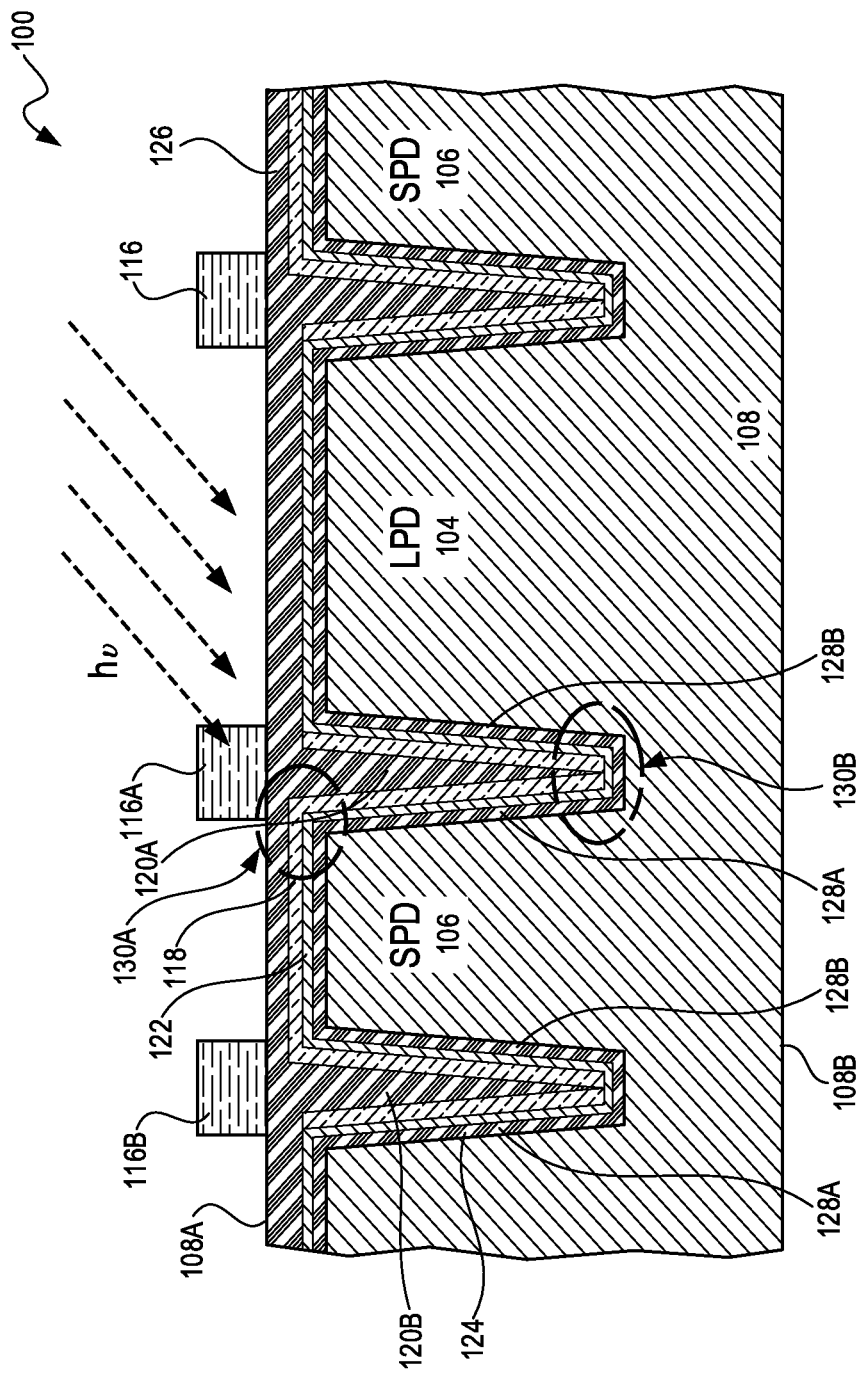
FIG. 2 is a cross-section view illustrating one example of an imaging system including an image sensor with a partially encapsulating light attenuation layer, in accordance with the teachings of the present disclosure.

FIG. 2 is a cross-sectional illustration of one example of a portion of an image sensor 100 with a partially encapsulating attenuation layer 118, in accordance with the teachings of the present disclosure. Referring to FIG. 2, the image sensor 100 includes a first photodiode (e.g., small photodiode 106) and a second photodiode (e.g., large photodiode 104), each disposed within a semiconductor material 108, between a first side 108A and a second side 108B of the semiconductor material 108 opposite to the first side 108A. In some embodiments, the first side 108A may be referred to as an illuminated side of the image sensor 100, and the second side 108b may be referred to as a non-illuminated side of the image sensor 100. The image sensor has a first deep trench isolation (DTI) region 120A and a second DTI region 120B. Each of the first DTI region 120A and the second DTI region 120B is configured to extend from the first side 108A of the semiconductor material 108 toward the second side 108B. The first DTI region 120A is disposed between the first photodiode 106 and the second photodiode 104, and wherein the first photodiode 106 is disposed between the first DTI region 120A and the second DTI region 120B.

The image sensor 100 further includes a buffer oxide layer 126 disposed proximate to the first side 108A of the semiconductor material and extending laterally over the first photodiode 106 and the second photodiode 104, the buffer oxide layer 126 further extends into each of the first DTI region 120A and the second DTI region 120B from the first side 108A towards the second side 108B of the semiconductor material 108.

The image sensor 100 includes a light attenuation layer 118 that partially encapsulates the first photodiode 106 by extending laterally from the first DTI region 120A to the second DTI region 120B between the semiconductor material 108 and the buffer oxide layer 126 covering a light exposure region of the first photodiode 106 such that all light directed (for example incident light directed by microlens 102A or stray light crossing over from an adjacent second photodiode 104) to the first photodiode 106 passes through the light attenuation layer 118 and with an intensity that is reduced by the attenuation layer 118, thus preventing saturation of the first photodiode 106 during an integration of the image sensor 100.

The partially encapsulating light attenuation layer 118 can include Ti (titanium), TiN (titanium nitride), Al (aluminum), or W (tungsten). In some embodiments, the light attenuation layer 118 has a layered structure, where each layer independently includes Ti, TiN, Al, and/or W. The total thickness of the light attenuation layer 118 can be configured from 100 Å to 1000 Å based on a desired required light transmittance or the light sensitivity of the first photodiode 106. When the light attenuation layer 118 has a layered structure, each layer can have a thickness of from 100 Å to 500 Å depending on the material (e.g., Ti, TiN, W, Al) used, so long as the total thickness of the light attenuation layer 118 is from 100 Å to 1000 Å.

In one embodiment, the partially encapsulating light attenuation layer 118 is disposed, at least in part, between the first photodiode 106 and the second photodiode 104, and the partially encapsulating light attenuation layer 118 is not optically aligned with the second photodiode 104 relative to incident light perpendicular to the first side 108A of the semiconductor material 108. In some embodiments, the first photodiode 106 that is partially encapsulated by the light attenuation layer 118 has a first full well capacity that is less than a second full well capacity of the second photodiode 104. Alternatively, the amount of photogenerated charges accumulated in the first photodiode 106 is less than the amount of photogenerated charges accumulated in the second photodiode 104.

Referring again to FIG. 2, the first photodiode 106 has a first lateral area (or a first light exposure area) and the second photodiode 104 has a second lateral area (or a second light exposure area), the first lateral area is less than the second lateral area. Thus, the first photoelectrode is the photodiode having a smaller lateral surface area or smaller light exposure area.

In some embodiments, the partially encapsulating light attenuation layer 118 is a multi-layer structure including a first layer of a first material and a second layer of a second material. For example, the first material can include titanium nitride and the second material can include titanium. In some embodiments, the attenuation layer 118 can include two or more materials.

The image sensor can further include a metal pattern (e.g., a metal grid 116) structured to form a first aperture optically aligned over the first photodiode 106 and a second aperture optically aligned over the second photodiode 104. The metal pattern includes a first metal structure 116A proximate to the first DTI region 120A and a second metal structure 116B proximate to the second DTI region 120B, a first portion of the partially encapsulating light attenuation layer 118 is disposed between the first metal structure 116A and the semiconductor material 108, and a second portion of the partially encapsulating light attenuation layer 118 is disposed between the second metal structure 116B and the semiconductor material 108.

In some embodiments, the partially encapsulating light attenuation layer 118 does not extend laterally over the second photodiode 104, i.e., no part of light attenuation layer 118 lies within the second aperture above the second photodiode 104.

Referring again to FIG. 2, the image sensor 100 can further include a high-κ oxide layer 124 disposed between the light attenuation layer 118 and the semiconductor material 108. The high-κ oxide layer 124 has a dielectric constant that is greater than a dielectric constant of the buffer oxide layer 126. As shown in FIG. 2, the high-κ oxide layer continuously extends laterally from the first DTI region 120B over the first lateral area of the first photodiode 106 into the second DTI region 120B and from the second DTI region 120B over to the second lateral area of the second photodiode 104.

In some embodiments, referring again to FIG. 2, a thin oxide layer 122 is disposed between the high-κ oxide layer 124 and the partially encapsulating light attenuation layer 118. The thickness of the partially encapsulating light attenuation layer 118 can be greater than the thickness of the thin oxide layer 122. The thin oxide layer 122 can extend laterally from the second DTI region 120B to the second photodiode 104.

In some embodiments, the first DTI region 120A and the second DTI region 120B include sidewalls 128A and 128B formed of the semiconductor material that extend a respective depth from the first side 108A to the second side 108B of the semiconductor material 108, and the partially encapsulating light attenuation layer 118 can extend along the sidewalls of the first DTI region 120A and the second DTI region 120B between the semiconductor material 108 and the buffer oxide layer 126.

In some embodiments, the sidewalls of the first DTI region 120A include a first sidewall 128A and a second sidewall 128B, wherein a first portion of the buffer oxide layer 126 is disposed between the first sidewall 128A and the second sidewall 128B, and wherein the attenuation layer 118 extends continuously along the first sidewall 128A to the second sidewall 128B between the first portion of the buffer oxide layer 126. The high-κ oxide layer 124 extends continuously along the first sidewall 128A to the second sidewall 128B onto the lateral surface area of adjacent first and second photodiodes.

As may be observed from FIG. 2, the light attenuation layer 118 is deposited to at least partially encapsulate the first photodiode 106, and covers the entire first lateral area of the first photodiode 106, and sidewalls 128A. 128B of the first DTI region 120A, and the second DTI region 120B. In other words, the light attenuation layer 118 is deposited to cover the entire light reception area of the first photodiode 106 including edges/corners 130A and 130B. The light attenuation layer 118 prevents the first photodiode 106 from direct exposure to the incident light, i.e., prevents the first photodiode 106 from receiving the maximum intensity of the incident light, thus reducing the likelihood that the first photodiode 106 is saturated during the integration period of the image sensor 100, which can affect the high dynamic sensing operation of image sensor 100.

In some embodiments, referring to FIG. 1B, the pixel cell further includes a first microlens 102A optically aligned with the first photodiode 106; and a second microlens 102B optically aligned with the second photodiode 104. The first microlens 102A has a first lateral area less than the lateral area of the second microlens 102B. The light attenuation layer 118 is disposed between the first microlens 102A and the first photodiode 106, and the light attenuation layer 118 is not disposed between the second microlens 102B and the second photodiode 104. The first microlens 102A operatively directs incident light through the respective color filter of the color filter layer 117 and the light attenuation layer 118 onto the respective first photodiode 106. The second microlens 102B operatively directs incident light through the respective color filter of the color filter layer 117 onto the respective second photodiode 104.

In some embodiments, a first height of the first microlens 102A, i.e., a distance between the top of the first microlens 102A and the color filter layer 117, may be different from a second height of second microlens 102B, i.e., the distance between the top of second microlens 102B and the color filter layer 117. For example, the second height of second microlens 102B may be greater than the first microlens 102A, i.e., the second microlens 102B is taller than the first microlens 102A, to compensate for the curvature differences between first microlens 102A and the second microlens 102B such that the first microlens 102A and the second microlens 102B have substantially the same focal length for their respective first photodiode 106 and second photodiode 104.

Figure 3A:
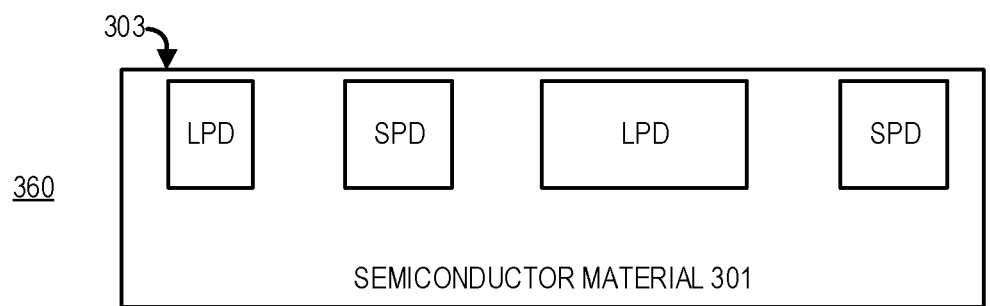
FIGS. 3A and 3B show an example method for forming an image sensor with a partially encapsulating light attenuation layer, in accordance with the teachings of the present disclosure.
Figure 3A:
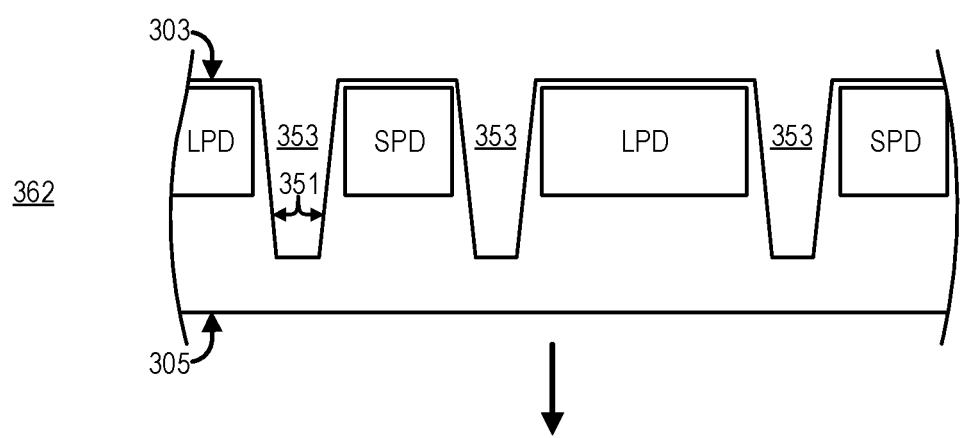
Figure 3A:
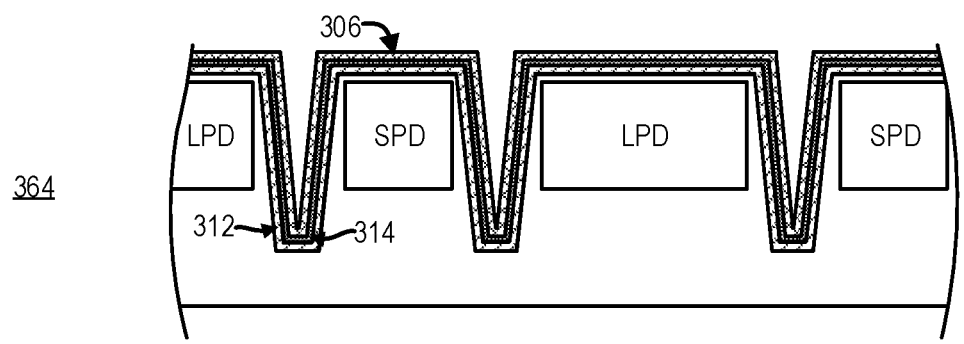
Figure 3B:
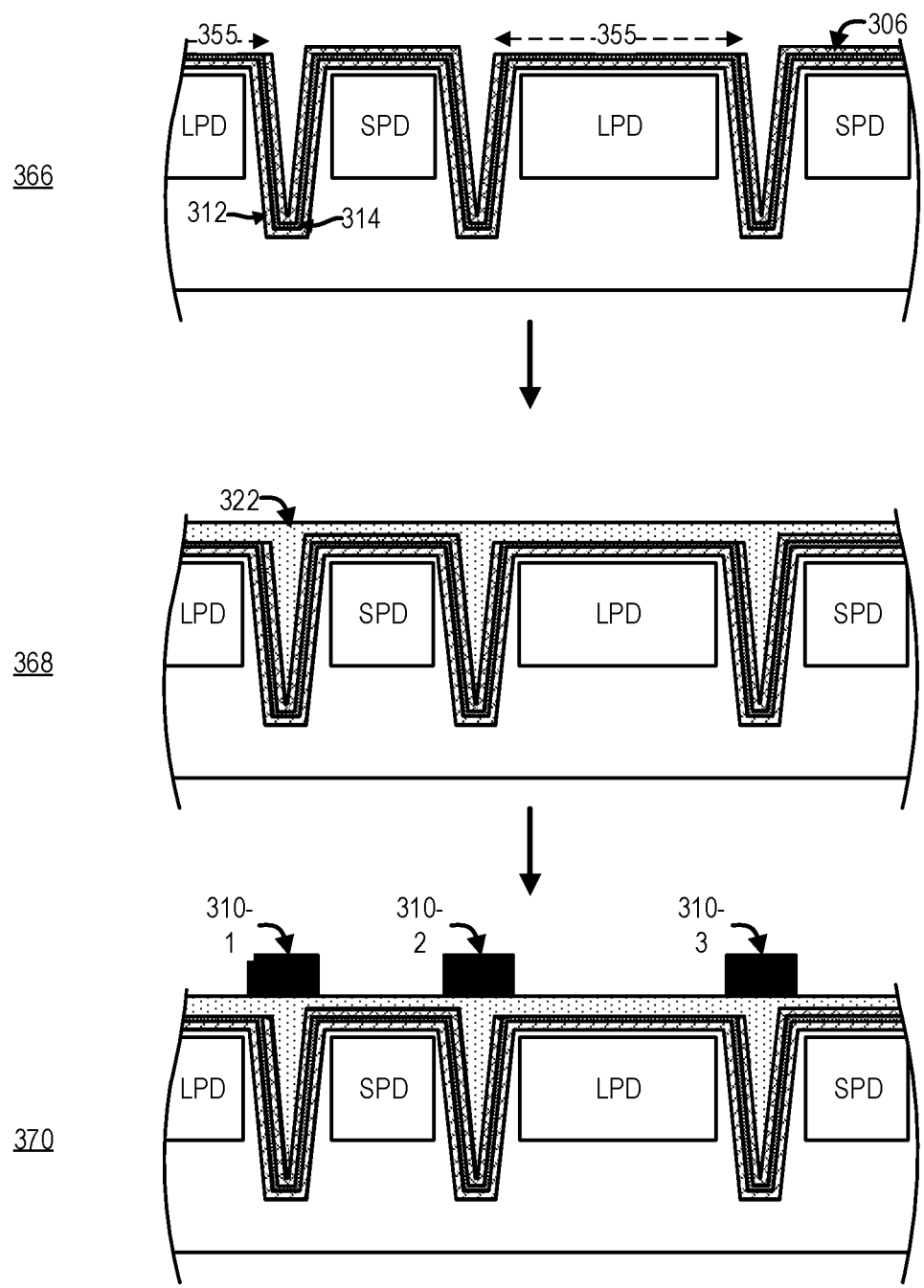

FIGS. 3A and 3B are cross-sectional illustrations of an example of a process of making the image sensor of the present disclosure. Referring to FIGS. 3A and 3B, the image sensor can be made by providing a semiconductor material 301 having a first side 303 and a second side 305 opposite the first side 303, the semiconductor material 301 includes pixel cells arranged in an array, each of the pixel cells including a first photodiode SPD (small photodiode) and a second photodiode LPD (large photodiode) disposed within the semiconductor material (step 360). Then, a plurality of trenches 353 is formed in step 362, for example, by patterning and etching the semiconductor material 301. The plurality of trenches 353 has sidewalls 351 extending from the first side 303 towards the second side 305 of the semiconductor material 301, and individual trenches 353 included in the plurality of trenches are disposed between the first photodiode SPD and the second photodiode LPD of a respective one of the pixel cells.

Referring again to FIG. 3A, in step 364, a high-κ oxide layer 312, an optional thin oxide layer 314, and a light attenuation layer 306 are deposited in sequence onto the semiconductor material. For example, the high-κ oxide layer 312 can be first deposited onto the semiconductor material 301, and can be disposed between the light attenuation layer 306 and the semiconductor material 301. The high-κ oxide layer 312 can have a dielectric constant that is greater than a dielectric constant of the buffer oxide layer 322 (supra). The high-κ oxide layer 312 can include HfO (hafnium oxide) and/or $Al_2O_3$ (alumina), and can have a thickness of from 10 Å to 100 Å. Step 364 can include optionally forming a thin oxide layer 314 over the high-κ oxide layer 312, such that the thin oxide layer 314 is disposed between the high-κ oxide layer 312 and the light attenuation layer 306. The thin oxide layer 314 can have a thickness of from 100 Å to about 500 Å. Each of the high-κ oxide layer 312 and thin oxide layer 314 can extend over the small and large photodiodes, and into each of the plurality of trenches 353 and along sidewalls 351 of the individual trenches 355.

Then, in step 364, the light attenuation layer 306 proximate to the first side 303 of the semiconductor material 301 is formed, the light attenuation layer 306 extends into each of the plurality of trenches 353 and along sidewalls 351 of the individual trenches 353 to partially encapsulate the first photodiode (SPD) of each of the pixel cells. The light attenuation layer 306 can include one or more of Ti, TiN, Al, and W. In some embodiments, the light attenuation layer 306 is a multi-layer structure including a first light attenuation layer of a first material (e.g., Ti) and a second light attenuation layer of a second material (e.g., TiN) formed on the first attenuation layer. In some embodiments, the first light attenuation layer, for example, formed of titanium, may be formed proximate to the first side 303 of the semiconductor material 301 with a first thickness by a deposition process, and injecting nitrogen atom thereafter reacting with the first light attenuation layer of titanium to form the second light attenuation layer of titanium nitride having a second thickness. In some embodiments, when forming the light attenuation layer 306, the light attenuation layer 306 extends laterally across the first photodiode SPD and the second photodiode LPD for each of the pixel cells. The thickness of the attenuation layer 306 can be from 100 Å to 500 Å, and/or can be greater than the thickness of the thin oxide layer 314 depending on the material used and desired light transmittance or light sensitivity required for the first photodiode (SPD).

Referring to step 366, a plurality of apertures 355 is formed within the light attenuation layer 306, each aperture in the plurality of apertures 355 is optically aligned with the second photodiode LPD of a given pixel cell. The apertures 355 can be made using lithography and etching processes, on portions of the light attenuation layer 306 disposed laterally over the second photodiode LPD included in each of the pixel cells, i.e., etching portions of the light attenuation layer 306 laterally disposed over the second photodiode LPD in each of the pixel cells, such that no part of light attenuation layer 306 lies within the apertures above the second photodiode LPD.

Referring now to step 368, a buffer oxide layer 322 proximate to the first side of the semiconductor material 301 is formed on the image sensor, extending laterally over the first photodiode SPD and the second photodiode LPD of each of the pixel cells, and further extending into each of the plurality of trenches 353 to substantially fill each of the individual trenches 353, such that within each of the individual trenches 353 the light attenuation layer 306 is disposed between the semiconductor material 301 and the buffer oxide layer 322. Dielectric material such as silicon oxide can be deposited onto the first side 303 of the semiconductor material 301 of the image sensor, and chemical mechanical polishing (CMP) can be carried out afterward to planarize the dielectric material to form the buffer oxide layer 322.

Finally, referring to step 370, a conductive layer (e.g., a W (tungsten) layer) can be deposited on the surface of the buffer oxide layer 322. The conductive layer is then subjected to lithography and etching to provide a plurality of intersecting metal structures above the plurality of trenches 353 forming a metal grid, portions of which are shown as 310-1, 310-2, and 310-3 in step 370.

Figure 4:
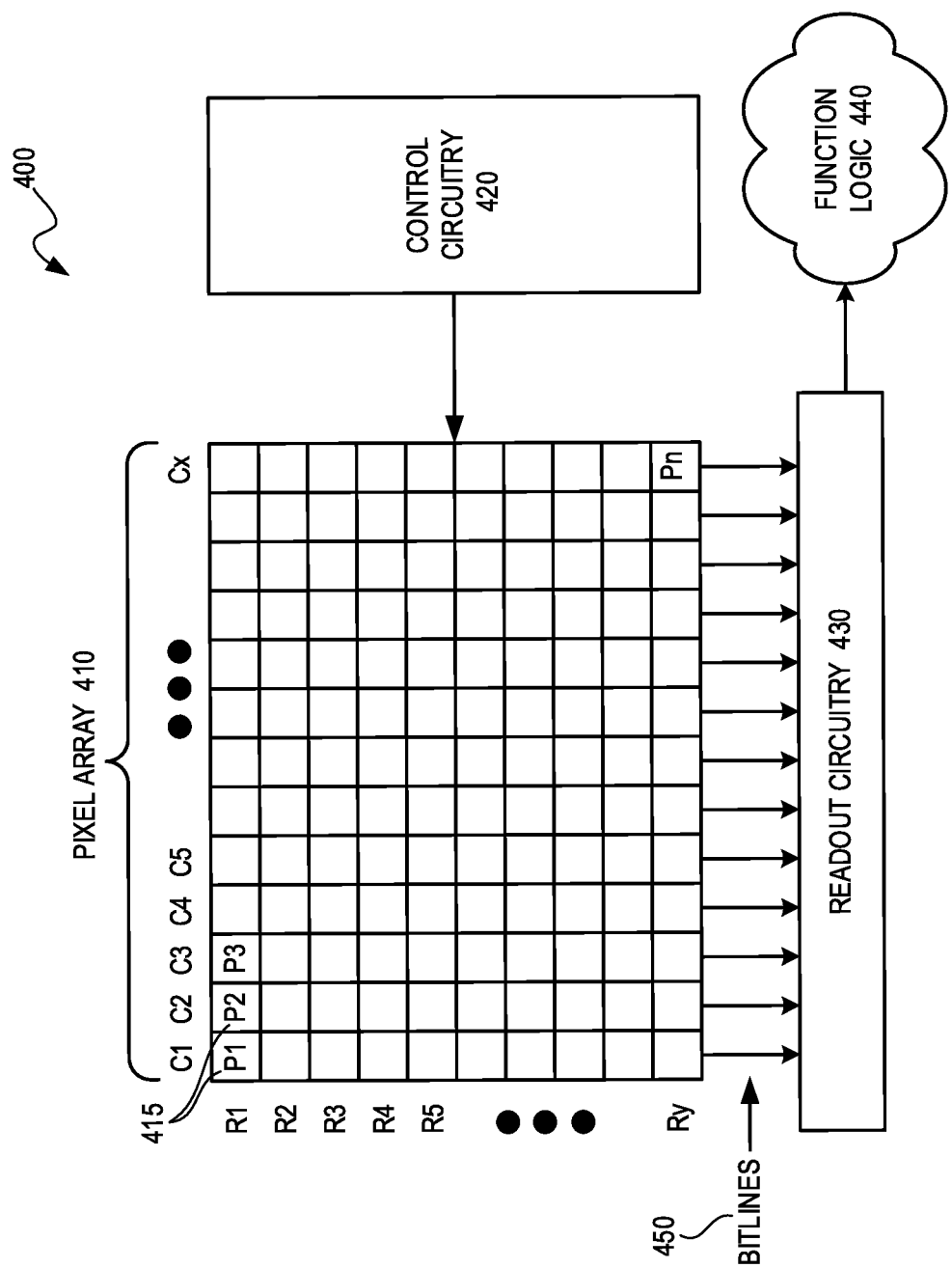
FIG. 4 is a block diagram illustrating one example of imaging system 200.

FIG. 4 is a diagram illustrating one example of an imaging system 400 with a pixel array 410 in accordance with the teachings of the present invention. As shown in the depicted example, an imaging system 400 includes a pixel array 410 coupled to a control circuitry 420 and a readout circuitry 430, which is coupled to a function logic 440.

Pixel array 410 is a two-dimensional ("2D") array of pixels 415 (e.g., pixels P1, P2 . . . , Pn), and the pixels are as described in the present disclosure. In one embodiment, each pixel is a complementary metal-oxide-semiconductor ("CMOS") imaging pixel. Pixel array 410 may be implemented as either a front side illuminated image sensor array, or a backside illuminated image sensor array. In one embodiment, pixel array 410 includes a pixel array, such as the pixel array depicted in FIG. 1A. The pixel array 410 includes a plurality of pixels 415 as described in the present disclosure. As illustrated, each pixel 415 is arranged into a row (e.g., rows R1 to Ry) and a column (e.g., column C1 to Cx) to acquire image data of a person, place, or object, which can then be used to render a 2D image of the person, place, or object.

As an example, referring again to FIGS. 3A and 3B, each one of the pixel cells in the pixel array can include: a first photodiode (e.g., SPD) and a second photodiode (e.g., LPD), each disposed within a semiconductor material between a first side 303 and a second side 305 of the semiconductor material 301. The pixel cell can include a deep trench isolation (DTI) region (e.g., DTI region 120A/120B) disposed in a trench 353 disposed between the first photodiode SPD and the second photodiode LPD. The DTI region includes sidewalls 351 formed of the semiconductor material 301. The pixel cell can include a buffer oxide layer 322 disposed proximate to the first side 303 of the semiconductor material and extending laterally over the first photodiode SPD and the second photodiode LPD, the buffer oxide layer 322 further extending into the DTI region disposed in the trench region 353. The pixel cell further includes a light attenuation layer 306 that partially encapsulates the first photodiode SPD by extending laterally from the DTI region to the first photodiode SPD between the semiconductor material 301 and the buffer oxide layer 322, the light attenuation layer 306 further extending along the sidewalls 351 formed of the semiconductor material 301 within the DTI region (e.g., DTI region 120A/120B) disposed within the trench region 353. As shown in FIG. 4, a control circuitry 420 is coupled to the pixel array 410 to control operation of the pixel array 410; and a readout circuitry 430 coupled to the pixel array 410 to readout image data from the pixel cells 415.

In some embodiments, for each of the pixel cells 415 the attenuation layer is disposed, at least in part, between the first photodiode SPD and the second photodiode LPD, the attenuation layer is not optically aligned with the second photodiode LPD relative to incident light perpendicular to the first side of the semiconductor material 301.

Referring again to FIG. 4, in one embodiment, after each pixel 415 has acquired its image data or image charge, the image data is readout by readout circuitry 430 and transferred to function logic 440. Readout circuitry 430 may include amplification circuitry, e.g., a differential amplifier circuitry, analog-to-digital ("ADC") conversion circuitry, or otherwise.

Function logic 440 may include logic and memory for storing the image data or even manipulating the image data by applying post image effects (e.g., crop, rotate, remove red eye, adjust brightness, adjust contrast, or otherwise). In one example, the readout circuitry 430 may readout a row of image data at a time along readout column lines (illustrated) or may readout the image data using a variety of other techniques (not illustrated), such as a serial readout or a full parallel readout of all pixels simultaneously.

Control circuitry 420 is coupled to pixel array 410. Control circuitry 420 may include logic and memory for controlling operational characteristic of pixel array 410. For example, control circuitry 420 may generate a shutter signal for controlling image acquisition. In one embodiment, the shutter signal is a global shutter signal for simultaneously enabling all pixels 415 within pixel array 410 to simultaneously capture their respective image data during a single acquisition window. In an alternative embodiment, the shutter signal is a rolling shutter signal whereby each row, column, or group of pixels is sequentially enabled during consecutive acquisition windows.

As can be appreciated by the above description of the image sensor with split pixel structures and methods of manufacturing the same, the disclosure provides for an image sensor with improved performance with regards to high intensity light sensing.

The processes explained above may be implemented using software and/or hardware. The techniques described may constitute machine-executable instructions embodied within a tangible or non-transitory machine (e.g., computer) readable storage medium, that when executed by a machine (e.g., control circuitry 420 of FIG. 4) will cause the machine to perform the operations described. Additionally, the processes may be embodied within hardware, such as an application specific integrated circuit ("ASIC"), field programmable gate array (FPGA), or otherwise.

A tangible machine-readable storage medium includes any mechanism that provides (i.e., stores) information in a non-transitory form accessible by a machine (e.g., a computer, network device, personal digital assistant, manufacturing tool, any device with a set of one or more processors, etc.). For example, a machine-readable storage medium includes recordable/non-recordable media (e.g., read only memory (ROM), random access memory (RAM), magnetic disk storage media, optical storage media, flash memory devices, etc.).

In one example, imaging system 400 can be included in a digital camera, cell phone, laptop computer, automobile or the like. Additionally, imaging system 400 can be coupled to other pieces of hardware such as a processor (general purpose or otherwise), memory elements, output (USB port, wireless transmitter, HDMI port, etc.), lighting/flash, electrical input (keyboard, touch display, track pad, mouse, microphone, etc.), and/or display. Other pieces of hardware can deliver instructions to imaging system 400, extract image data from imaging system 400, or manipulate image data supplied by imaging system 400.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A pixel cell, comprising:
   a first photodiode and a second photodiode, each disposed within a semiconductor material between a first side and a second side of the semiconductor material;
   a first deep trench isolation (DTI) region and a second DTI region, wherein the first DTI region is disposed between the first photodiode and the second photodiode, and wherein the first photodiode is disposed between the first DTI region and the second DTI region;
   a buffer oxide layer disposed proximate to the first side of the semiconductor material and extending laterally over the first photodiode and the second photodiode, wherein the buffer oxide layer further extends into each of the first DTI region and the second DTI region from the first side towards the second side of the semiconductor material;
   an attenuation layer that partially encapsulates the first photodiode by extending laterally from the first DTI region to the second DTI region covering a light exposure area of the first photodiode between the semiconductor material and the buffer oxide layer;
   a first microlens capable of directing an incident light to the first photodiode; and
   a second microlens capable of directing the incident light to the second photodiode.

2. The pixel cell of claim 1, wherein the attenuation layer is disposed, at least in part, between the first photodiode and the second photodiode, and wherein the attenuation layer is not optically aligned with the second photodiode relative to incident light perpendicular to the first side of the semiconductor material.

3. The pixel cell of claim 1, wherein the first photodiode that is partially encapsulated by the attenuation layer has a first full well capacity that is less than a second full well capacity of the second photodiode.

4. The pixel cell of claim 3, wherein the first photodiode has a first lateral area and the second photodiode has a second lateral area, and wherein the first lateral area is less than the second lateral area; wherein the attenuation layer is configured to continuously extend from the first DTI region to the second DTI region covering the first lateral area.

5. The pixel cell of claim 1, wherein the attenuation layer is a multi-layer structure including a first layer of a first material and a second layer of a second material.

6. The pixel cell of claim 5, wherein the first material is titanium nitride and the second material is titanium.

7. The pixel cell of claim 1, further comprising:
   a metal pattern structured to form a first aperture optically aligned over the first photodiode and a second aperture optically aligned over the second photodiode, and wherein the metal pattern includes a first metal structure proximate to the first DTI region and a second metal structure proximate to the second DTI region, wherein a first portion of the attenuation layer is disposed between the first metal structure and the semiconductor material, and wherein a second portion of the attenuation layer is disposed between the second metal structure and the semiconductor material.

8. The pixel cell of claim 1, wherein the attenuation layer does not extend laterally over the second photodiode.

9. The pixel cell of claim 8, further comprising:
   a thin oxide layer disposed between the high-κ oxide layer and the attenuation layer, wherein a first thickness of the attenuation layer is greater than a second thickness of the thin oxide layer, and wherein the thin oxide layer extends laterally from the second DTI region to the second photodiode.

10. The pixel cell of claim 1, further comprising:
    a high-κ oxide layer disposed between the attenuation layer and the semiconductor material, wherein the high-κ oxide layer has a first dielectric constant that is greater than a second dielectric constant of the buffer oxide layer, and wherein the high-κ oxide layer extends laterally from the second DTI region to the second photodiode.

11. The pixel cell of claim 1, wherein the first DTI region and the second DTI region include sidewalls formed of the semiconductor material that extend a respective depth from the first side to the second side of the semiconductor material, and wherein the attenuation layer extends along the sidewalls of the first DTI region and the second DTI region between the semiconductor material and the buffer oxide layer.

12. The pixel cell of claim 11, wherein the sidewalls of the first DTI region include a first sidewall and a second sidewall, wherein a first portion of the buffer oxide layer is disposed between the first sidewall and the second sidewall, and wherein the attenuation layer extends continuously along the first sidewall to the second sidewall between the first portion of the buffer oxide layer.

13. The pixel cell of claim 1, wherein:
    the first microlens is optically aligned with the first photodiode; and
    the second microlens is optically aligned with the second photodiode, wherein the first microlens has a first lateral area less than a second lateral area of the second microlens, wherein the attenuation layer is disposed between the first microlens and the first photodiode, and the incident light directed by the first microlens passes through the attenuation layer before reaching the first electrode; wherein the attenuation layer is not disposed between the second microlens and the second photodiode, and the incident light directed by the second microlens passes through the buffer oxide layer before reaching the second electrode.

14. An imaging system, comprising:
    a pixel array of pixel cells, wherein each one of the pixel cells includes:

a first photodiode and a second photodiode, each disposed within a semiconductor material between a first side and a second side of the semiconductor material;

a first deep trench isolation (DTI) region disposed between the first photodiode and the second photodiode, wherein the first DTI region includes a first sidewall and a second sidewall each formed of the semiconductor material, and wherein the first sidewall is disposed between the first photodiode and the second sidewall;

a buffer oxide layer disposed proximate to the first side of the semiconductor material and extending laterally over the first photodiode and the second photodiode, wherein the buffer oxide layer further extends into the first DTI region between sidewalls formed of the semiconductor material from the first side towards the second side of the semiconductor material;

an attenuation layer that partially encapsulates the first photodiode by extending laterally from the first DTI region to the first photodiode between the semiconductor material and the buffer oxide layer, wherein the attenuation layer covers a light exposure area of the first photodiode, and wherein the attenuation layer further extends along the sidewalls formed of the semiconductor within the first DTI region;

a first microlens capable of directing an incident light to the first photodiode; and a second microlens capable of directing the incident light to the second photodiode;

control circuitry coupled to the pixel array to control operation of the pixel array; and readout circuitry coupled to the pixel array to readout image data from the pixel cells.

15. The imaging system of claim 14, wherein for each of the pixel cells the attenuation layer is disposed, at least in part, between the first photodiode and the second photodiode, and wherein the attenuation layer is not optically aligned with the second photodiode relative to incident light perpendicular to the first side of the semiconductor material.

16. The imaging system of claim 14, wherein for each of the pixel cells the first photodiode that is partially encapsulated by the attenuation layer has a first full well capacity that is less than a second full well capacity of the second photodiode.

17. The imaging system of claim 16, wherein for each of the pixel cells the first photodiode has a first lateral area of the first photodiode and the second photodiode has a second lateral area, and wherein the first lateral area is less than the second lateral area of the second photodiode, wherein the attenuation layer is configured to continuously extend from the first DTI region to the second DTI region covering the first lateral area of the first photodiode.

18. The imaging system of claim 14, wherein for each of the pixel cells the attenuation layer is a multi-layer structure including a first layer of a first material and a second layer of a second material disposed on the first layer of the attenuation layer.

19. The imaging system of claim 18, wherein the first material is titanium nitride and the second material is titanium.

20. The imaging system of claim 14, wherein each of the pixel cells further includes:

a metal pattern structured to form a first aperture optically aligned over the first photodiode and a second aperture optically aligned over the second photodiode, and wherein the metal pattern includes a first metal structure proximate to the first DTI region and a second metal structure proximate to the second DTI region, wherein a first portion of the attenuation layer is disposed between the first metal structure and the semiconductor material, and wherein a second portion of the attenuation layer is disposed between the second metal structure and the semiconductor material.

21. The imaging system of claim 14, wherein for each of the pixel cells the attenuation layer does not extend laterally over the second photodiode.

22. The imaging system of claim 21, wherein each of the pixel cells further comprises:

a thin oxide layer disposed between the high-κ oxide layer and the attenuation layer, wherein a first thickness of the attenuation layer is greater than a second thickness of the thin oxide layer, and wherein the thin oxide layer extends laterally from the second DTI region to the second photodiode, wherein the first thickness of the attenuation layer ranges from 100 Å to 1000 Å; and wherein the second thickness of the thin oxide layer ranges from 30 Å to 100 Å.

23. The imaging system of claim 14, wherein each of the pixel cells further includes:

a high-K oxide layer disposed between the attenuation layer and the semiconductor material, wherein the high-K oxide layer has a first dielectric constant that is greater than a second dielectric constant of the buffer oxide layer, and wherein the high-K oxide layer extends laterally from the second DTI region to the second photodiode.

24. The imaging system of claim 14, wherein for each of the pixel cells the first DTI region and the second DTI region include sidewalls formed of the semiconductor material that extend a respective depth from the first side to the second side of the semiconductor material, and wherein the attenuation layer extends along the sidewalls of the first DTI region and the second DTI region between the semiconductor material and the buffer oxide layer.

25. The imaging system of claim 24, wherein for each of the pixel cells the sidewalls of the first DTI region include a first sidewall and a second sidewall, wherein a first portion of the buffer oxide layer is disposed between the first sidewall and the second sidewall, and wherein the attenuation layer extends continuously along the first sidewall to the second sidewall between the first portion of the buffer oxide layer.

26. The imaging system of claim 14, wherein:

the first microlens is optically aligned with the first photodiode; and the second microlens is optically aligned with the second photodiode, wherein the first microlens has a first lateral area less than a second lateral area of the second microlens, wherein the attenuation layer is disposed between the first microlens and the first photodiode, and the incident light directed by the first microlens passes through the attenuation layer before reaching the first electrode; wherein the attenuation layer is not disposed between the second microlens and the second photodiode, and the incident light directed by the second microlens passes through the buffer oxide layer before reaching the second electrode.

27. A method of image sensor fabrication, comprising:

providing a semiconductor material having a first side and a second side opposite the first side, wherein the semiconductor material includes pixel cells arranged in an array, each of the pixel cells including a first photodiode and a second photodiode disposed within the semiconductor material;

forming a plurality of trenches extending from the first side towards the second side of the semiconductor material, wherein individual trenches included in the plurality of trenches are disposed between the first photodiode and the second photodiode of a respective one of the pixel cells;

forming an attenuation layer proximate to the first side of the semiconductor material, wherein the attenuation layer extends into each of the plurality of trenches and along sidewalls of the individual trenches to partially encapsulate and cover a light exposure area of the first photodiode of each of the pixel cells.

28. The method of claim 27, further comprising forming a buffer oxide layer proximate to the first side of the semiconductor material, wherein the buffer oxide layer extends laterally over the first photodiode and the second photodiode of each of the pixel cells, and wherein the buffer layer further extends into each of the plurality of trenches to substantially fill each of the individual trenches such that within each of the individual trenches, the attenuation layer is disposed between the semiconductor material and the buffer oxide layer.

29. The method of claim 27, wherein the attenuation layer further extends laterally across the first photodiode and the second photodiode for each of the pixel cells when forming the attenuation layer.

30. The method of claim 29, further comprising:

forming a plurality of apertures within the attenuation layer, each aperture included in the plurality of apertures optically aligned with the second photodiode of a respective one of the pixel cells, by etching portions of the attenuation layer disposed laterally over the second photodiode included in each of the pixel cells.

31. The method of claim 30, further comprising:

forming a high-κ oxide layer disposed between the attenuation layer and the semiconductor material, wherein the high-κ oxide layer has a first dielectric constant that is greater than a second dielectric constant of the buffer oxide layer; and forming a thin oxide layer disposed between the high-κ oxide layer and the attenuation layer, wherein a first thickness of the attenuation layer is greater than a second thickness of the thin oxide layer.

32. The method of claim 27, wherein forming the attenuation layer comprises:

depositing a first material proximate to the first side of the semiconductor material forming a first attenuation layer; and depositing a second material on the first attenuation layer forming a second attenuation layer.

* * * * *

UNITED STATES PATENT AND TRADEMARK OFFICE
CERTIFICATE OF CORRECTION

| | |
|---|---|
| PATENT NO. | : 11,233,080 B2 |
| APPLICATION NO. | : 16/730137 |
| DATED | : January 25, 2022 |
| INVENTOR(S) | : Y. Liu et al. |

It is certified that error appears in the above-identified patent and that said Letters Patent is hereby corrected as shown below:

In the Claims

| Column | Line | |
|---|---|---|
| 12 | 19 | Claim 9 change "between the" to -- between a -- |
| 14 | 14 | Claim 22 change "between the" to -- between a -- |
| 15 | 25 | Claim 29 change "claim 27" to -- claim 28 -- |

Signed and Sealed this
Fourteenth Day of June, 2022

Katherine Kelly Vidal
*Director of the United States Patent and Trademark Office*